United States Patent
Meliukh

(10) Patent No.: US 10,103,628 B2
(45) Date of Patent: Oct. 16, 2018

(54) SWITCHLESS CAPACITIVE HIGH VOLTAGE SENSING

(71) Applicant: Dialog Semiconductor (UK) Limited, London (GB)

(72) Inventor: Siarhei Meliukh, Munich (DE)

(73) Assignee: Dialog Semiconductor (UK) Limited, London (GB)

( * ) Notice: Subject to any disclaimer, the term of this patent is extended or adjusted under 35 U.S.C. 154(b) by 273 days.

(21) Appl. No.: 15/232,382

(22) Filed: Aug. 9, 2016

(65) Prior Publication Data

US 2017/0179826 A1 Jun. 22, 2017

(30) Foreign Application Priority Data

Dec. 21, 2015 (DE) .................. 10 2015 226 252

(51) Int. Cl.
| | | |
|---|---|---|
| G01R 1/20 | (2006.01) | |
| H02M 3/158 | (2006.01) | |
| H02M 1/08 | (2006.01) | |
| G01R 19/00 | (2006.01) | |
| G01R 19/10 | (2006.01) | |

(Continued)

(52) U.S. Cl.
CPC .......... *H02M 3/158* (2013.01); *G01R 15/146* (2013.01); *G01R 19/0092* (2013.01); *G01R 19/10* (2013.01); *H02M 1/08* (2013.01); *H02M 2001/0009* (2013.01)

(58) Field of Classification Search
CPC .. G01R 19/0092; G01R 19/10; G01R 15/146; H02M 3/158; H02M 1/08
USPC ........................................................ 324/126
See application file for complete search history.

(56) References Cited

U.S. PATENT DOCUMENTS

| | | | | |
|---|---|---|---|---|
| 7,528,633 B2* | 5/2009 | Jung | ...................... | H03F 3/345 |
| | | | | 327/51 |
| 9,300,212 B2* | 3/2016 | Notman | .............. | H02M 3/1588 |
| 9,991,794 B2* | 6/2018 | Lueders | ................ | H02M 3/158 |

(Continued)

FOREIGN PATENT DOCUMENTS

| | | |
|---|---|---|
| DE | 10 2008 055 862 | 5/2010 |
| EP | 3 023 797 | 5/2016 |

OTHER PUBLICATIONS

German Office Action, File No. 10 2015 226 252.9, Applicant: Dialog Semiconductor (UK) Limited, dated Aug. 5, 2016, 7 pgs and English language translation, 7 pgs.

*Primary Examiner* — Jermele M Hollington
*Assistant Examiner* — Sean Curtis
(74) *Attorney, Agent, or Firm* — Saile Ackerman LLC; Stephen B. Ackerman

(57) ABSTRACT

A circuit and a method for sensing a current flowing through a pass device of a voltage converter. The pass device is switchable between a conducting state and a non-conducting state. The circuit contains an output node for providing an indication of the current flowing through the pass device, a capacitive element, connected between the pass device and the output node. A first switching element is connected between the first terminal of the capacitive element and ground. A second switching element is connected between the second terminal of the capacitive element and ground. A control circuit controls the first and second switching elements to isolate the output node from the terminal of the pass device through the capacitive element while the pass device is in the non-conducting state.

26 Claims, 6 Drawing Sheets

(51) Int. Cl.
  *G01R 15/14* (2006.01)
  *H02M 1/00* (2006.01)

(56) References Cited

U.S. PATENT DOCUMENTS

| | | | |
|---|---|---|---|
| 2007/0115741 A1* | 5/2007 | Jung | H03F 3/345 |
| | | | 365/205 |
| 2014/0347078 A1* | 11/2014 | Qin | G01R 19/0092 |
| | | | 324/713 |
| 2015/0023071 A1* | 1/2015 | Lin | H02M 3/33523 |
| | | | 363/21.18 |
| 2015/0098254 A1* | 4/2015 | Brinlee | H02M 3/3376 |
| | | | 363/21.02 |
| 2016/0036324 A1* | 2/2016 | Hofmann | H02M 3/156 |
| | | | 315/210 |
| 2016/0056730 A1* | 2/2016 | Yan | H02M 1/4225 |
| | | | 363/89 |
| 2017/0093296 A1* | 3/2017 | Chen | H02M 1/088 |
| 2017/0110973 A1* | 4/2017 | Chen | H02M 3/33546 |
| 2017/0179826 A1* | 6/2017 | Meliukh | H02M 3/158 |

* cited by examiner

SWITCHLESS CAPACITIVE HIGH VOLTAGE SENSING

TECHNICAL FIELD

This application relates to circuits and methods for high voltage sensing. The application particularly relates to such circuits and methods that allow for sensing currents flowing through high power output devices of high voltage switching converters such as boost converters, using low voltage devices, i.e. devices that are not high voltage tolerant.

BACKGROUND

High voltage switching converters, such as boost converters, are used for a wide array of applications, including backlight applications using strings of LEDs, for example. For appropriately controlling such voltage converters, it is essential to have access to an indication of the current flowing through the switching node (LX node) of the voltage converter (i.e. through the (high power) output device of the voltage converter). On the other hand, the switching node must not be directly connected to low voltage devices (i.e. devices that are not high voltage tolerant) typically used in controlling voltage converters, such as comparators. The reason is that during the non-conducting phase of the pass device, the voltage at the switching node rises to very high values, especially for boost converters, which would damage or destroy the aforementioned low voltage devices.

To address this issue, a blanking switch might be provided between the switching node and the low voltage device in question to isolate the low voltage device from the switching node while the pass device is in the non-conducting state. Typically, such blanking switches are implemented by transistors. These transistors should either be isolated devices and would require a large number of additional layers for implementation, or non-isolated but should be able to operate at conditions when the source-bulk voltage is above zero. Thus, depending on the specific mode of operation of the blanking switch, implementation thereof by a transistor may be difficult and costly, or even impossible, especially in cases in which the transistor may not be operated in a mode in which the source-bulk voltage is above zero. Moreover, especially for boost converters, the transistor implementing the blanking switch might not operate reliably (i.e. cease to operate or introduce inacceptable errors) at low supply voltages and/or high input currents.

SUMMARY

There is a need for an improved circuit for sensing a current at a switching node of a high voltage switching converter, e.g. a boost converter, and for an improved method of sensing a current at a switching node of a high voltage switching converter. There further is a need for such circuit and method that enable high voltage sensing in cases in which high voltage isolated transistors are not available or in which source-bulk voltages of the transistor higher than zero would be required. There is yet further need for such circuit and method that enable correct and safe operation of the circuit at low supply voltages and high input currents. In view of some or all of these needs, the present document proposes a circuit for sensing a current flowing through a pass device of a voltage converter and a method of sensing a current flowing through a pass device of a voltage converter, having the features of the respective independent claims.

An aspect of the disclosure relates to a circuit for sensing a current flowing through a pass device of a voltage converter. The voltage converter may be a high voltage converter such as a high voltage switching converter, e.g. a boost converter. The supply voltage may be a high voltage. The pass device may be a transistor, such as a MOS transistor or a MOSFET, e.g. an NMOS transistor or PMOS transistor. The pass device may be connected between a switching node (LX node) of the voltage converter and ground or supply. The voltage converter may further comprise an inductive element connected between the switching node and a supply voltage level. Further, the pass device may be switchable between a conducting state and a non-conducting state, e.g. in accordance with a drive signal. The circuit may comprise an output node for providing an indication of current flowing through the pass device (i.e. the current at the switching node). The circuit may further comprise a (first) capacitive element. A first terminal of the capacitive element may be coupled (e.g. connected) to a terminal of the pass device and a second terminal of the capacitive element may be connected to the output node of the circuit. Said indication of the current flowing through the pass device may be an indication of a voltage at said terminal of the pass device, e.g. said voltage at said terminal of the pass device. The capacitive element may be a high-voltage tolerant device. Said terminal of the pass device may be a drain terminal, for example. The circuit may further comprise a first switching element connected between the first terminal of the capacitive element and ground. The circuit may further comprise a second switching element connected between the second terminal of the capacitive element and ground. The first and second switching devices may be transistors, such as MOS transistors or MOSFETs, e.g. NMOS transistors or PMOS transistors. The first switching element may be a high-voltage tolerant device, where the source and bulk may be shorted together. The second switching element may not be high-voltage tolerant. The circuit may yet further comprise a control circuit for controlling the first and second switching elements. The control circuit may be a sequencer, for example. The first switching element may be controlled by means of a first control signal and the second switching element may be controlled by means of a second control signal. The first and second control signals may be generated by the control circuit. The control circuit may be configured to control the first and second switching elements such that the output node of the circuit is isolated from the terminal of the pass device through the capacitive element while the pass device is in the non-conducting state. The control circuit may be further configured to control the first and second switching elements such that the voltage at the drain terminal of the pass device is applied to the output node of the circuit during a first period of time for which the pass device is in the conducting state. Respective time instances at which said switching operations are performed may be derived from the drive signal for the pass device, for example.

Configured as above, the circuit isolates the terminal of the pass device (i.e. the switching node) from the output node of the circuit during the non-conducting phase of the pass device, for which the voltage at the switching node may be very high. On the other hand, the correct indication of the current flowing through the pass device is provided (e.g. output) at the output node while the pass device is in the conducting state, at least during the first period of time. Accordingly, the output node of the circuit can be connected to low voltage devices, such as comparators, without risk of damaging or destroying these devices, and the indication of the current flowing through the pass device can be used e.g. for controlling of the voltage converter. The switching elements of the circuit can be implemented in a particularly simple manner by transistors with source and bulk terminals connected to each other and shorted to ground. Accordingly, contrary to the blanking switch used in the prior art, these transistors do not need to be tolerant to high source-bulk voltages, such as source-bulk voltages in excess of 1V, for example.

In embodiments, the control circuit may be configured to switch the first switching element to the non-conducting state and the second switching element to the conducting state while the pass device is in the non-conducting state. The phase in which the first switching element is in the non-conducting, state and the second switching element is in the conducting state may be referred to as isolation phase. Accordingly, while the pass device is in the non-conducting state, the output node of the circuit is isolated from the (potentially very high) voltage at the terminal of the pass device. The output node may thus be connected to (low voltage) circuits and devices that are not high voltage tolerant. For example, the output node may be connected to an input port of a comparator for comparing the indication of the current flowing through the pass device to a given reference value. At the same time, current consumption during the isolation phase is limited to the current initially flowing into the capacitive element and is thus very small.

In embodiments, the control circuit may be configured to switch the first and second switching elements to the conducting state during a second period of time for which the pass device is in the conducting state. Said switching may be performed in reaction to (i.e. immediately subsequent to) the pass device being switched to the conducting state. Said switching may be triggered by a level change of the drive signal for the pass device. In other words, the second period of time may commence as soon as the pass device is switched to the conducting state. The phase in which both the first and second switching elements are in the conducting state may be referred to as reset phase. During the reset phase, both terminals of the capacitive element are connected to ground so that the voltage across the capacitive element is reset to zero, i.e. the capacitive element is discharged.

In embodiments, the control circuit may be configured to switch the first and second switching elements to the non-conducting state during the first period of time. The first period of time may succeed the second period of time, i.e. the first period of time may commence as soon as the second period of time ends. The period of time during which the pass device is in the conducting state may consist of the first period of time and the second period of time, i.e. the first and second periods of time may cover the period of time during which the pass device is in the conducting state. The phase in which both the first and second switching elements are in the non-conducting state may be referred to as sense phase. During the sense phase, the voltage at the terminal of the pass device is applied to the output node of the circuit via the capacitive element. Since the voltage that is present at the terminal of the pass device while the pass device is in the conducting state is comparatively low, it may be applied, via the output node, to (low voltage) circuits and devices that are not high voltage tolerant without danger of damaging or destroying these circuits and devices.

In embodiments, the circuit may further comprise a (first) resistive element connected between the first terminal of the capacitive element and the terminal of the pass device. By providing the resistive element, the current flowing into the capacitive element and to ground especially during the reset phase can be limited, thereby limiting overall current consumption of the circuit.

In embodiments, the capacitive element may comprises a capacitor. Alternatively, the capacitive element may comprise a transistor. A drain terminal of the transistor may represent the first terminal of the capacitive element and a gate terminal of the transistor may represent the second terminal of the capacitive element. A source terminal and a bulk terminal of the transistor may be connected to ground. Then, the capacitance of the capacitive element may be provided for by a parasitic drain-gate capacitance of the transistor. By providing the transistor, a high voltage tolerant capacitive element can be provided in a particularly simple manner.

In embodiments, the circuit may further comprise a comparator. The output node of the circuit may be connected to an input port of the comparator. The comparator may output a control signal for controlling the voltage converter. For example, the drive signal for the pass device may be derived from the control signal. By virtue of the configuration of the circuit, the comparator may be a low voltage comparator, i.e. does not need to be high voltage tolerant.

In embodiments, the circuit may further comprise a reference circuit for providing an indication of a reference current to the other input port of the comparator. The reference circuit may comprise a replica device of the pass device. The reference circuit may further comprise a current source connected in series with the replica device. The reference circuit may be configured such that voltages at terminals of the replica device correspond to those voltages that are present at respective terminals of the pass device at least while the pass device is in the conducting state. The reference circuit may provide a reference value, e.g. a reference voltage value (corresponding to an indication of a reference current) for the indication for the current flowing through the pass device. For example, the drive signal for the pass device may be derived from a comparison of said indication of the current flowing through the pass device to said reference value.

In embodiments, the circuit may further comprise a second capacitive element. The second capacitive element may be of same type and same size as the (first) capacitive element, i.e. the second capacitive element may be identical to the (first) capacitive element. A first terminal of the second capacitive element may be coupled (e.g. connected) to a terminal of the replica device. A second terminal of the second capacitive element may be connected to said other input port of the comparator. The circuit may further comprise a third switching element connected between the first terminal of the second capacitive element and ground. The third switching element may be of same type and size as the first switching element, i.e. the third switching element may be identical to the first switching element. The circuit may further comprise a fourth switching element connected between the second terminal of the second capacitive element and ground. The fourth switching element may be of same type and size as the second switching element, i.e. the fourth switching element may be identical to the second switching element. The control circuit may be configured to control the third switching element to switch in phase with the first switching element and to control the fourth switching element to switch in phase with the second switching element. The third switching element may be controlled by means of the first control signal and the fourth switching element may be controlled by means of the second control signal. Providing the second capacitive element and the third and fourth switching elements results in symmetry of the circuit branches connected to respective input ports of the comparator and thus enables high accuracy of the comparison of said indication of the current flowing through the pass device to said reference value generated by the reference circuit.

In embodiments, the circuit may further comprise a second resistive element connected between the first terminal of the second capacitive element and the terminal of the replica device. The second resistive element may be of the same type and size as the (first) resistive element, i.e. the second resistive element may be identical to the (first) resistive element. The second resistive element serves to limit the current flowing into the second capacitive element and to ground especially during the reset phase, thereby limiting overall current consumption of the circuit.

In embodiments, the control circuit may be further configured to measure an input offset of the comparator in a state in which both the first and second switching elements are switched to the conducting state, e.g. during the reset phase. The control circuit may be further configured to provide a bias voltage for compensating the input offset of the comparator. The bias voltage may be provided to the comparator, e.g. to an appropriate port of the comparator. The bias voltage may be provided in a state in which both the first and second switching elements are switched to the non-conducting state, i.e. during the sense phase.

Another aspect of the disclosure relates to a method of sensing a current flowing through a pass device of a voltage converter. The pass device may be switchable between a conducting state and a non-conducting state. The voltage converter may further comprise a node for providing an indication of the current flowing through the pass device. The voltage converter may further comprise a (first) capacitive element. A first terminal of the capacitive element may be coupled (e.g. connected) to a terminal of the pass device and a second terminal of the capacitive element may be connected to said node. The voltage converter may further comprise a first switching element connected between the first terminal of the capacitive element and ground. The voltage converter may further comprise a second switching element connected between the second terminal of the capacitive element and ground. The method may comprise controlling the first and second switching elements such that said node is isolated from the terminal of the pass device through the capacitive element while the pass device is in the non-conducting state. The method may further comprise controlling the first and second switching elements such that the voltage at the terminal of the pass device is applied to said node during a first period of time for which the pass device is in the conducting state.

In embodiments, the method may comprise switching the first switching element to the non-conducting state and the second switching element to the conducting state while the pass device is in the non-conducting state.

In embodiments, the method may comprise switching the first and second switching elements to the conducting state during a second period of time for which the pass device is in the conducting state.

In embodiments, the method may comprise switching the first and second switching elements to the non-conducting state during the first period of time. The first period of time may succeed the second period of time.

In embodiments, the method may comprise comparing the indication of the current flowing through the pass device to an indication of a reference current.

In embodiments, the voltage converter may further comprise a replica device of the pass device for providing the indication of the reference current. The voltage converter may further comprise a second capacitive element. A first terminal of the second capacitive element may be coupled (e.g. connected) to a terminal of the replica device and a second terminal of the second capacitive element may be connected to said other input port of the comparator. The voltage converter may further comprise a third switching element connected between the first terminal of the second capacitive element and ground. The voltage converter may further comprise a fourth switching element connected between the second terminal of the second capacitive element and ground. The method may further comprise controlling the third switching element to switch in phase with the first switching element. The method may yet further comprise controlling the fourth switching element to switch in phase with the second switching element.

In embodiments, the method may further comprise measuring an input offset of the comparator in a state in which both the first and second switching elements are switched to the conducting state. The method may further comprise providing a bias voltage for compensating the input offset of the comparator.

It is understood that in the present document, the term "couple" or "coupled" refers to elements being in electrical communication with each other, whether directly connected e.g., via wires, or in some other manner.

Moreover, it will be appreciated that method steps and apparatus features may be interchanged in many ways. In particular, the details of the disclosed method can be implemented as an apparatus adapted to execute some or all or the steps of the method, and vice versa, as the skilled person will appreciate. In particular, it is understood that methods according to the disclosure relate to methods of operating the circuits according to the above embodiments and variations thereof, and that respective statements made with regard to the circuits likewise apply to the corresponding methods.

BRIEF DESCRIPTION OF THE DRAWINGS

Embodiments of the disclosure are explained below in an exemplary manner with reference to the accompanying drawings, wherein FIG. 1 schematically illustrates an example of a circuit for sensing a current flowing through a pass device of a voltage converter according to embodiments of the disclosure.

DESCRIPTION

Figure 6:
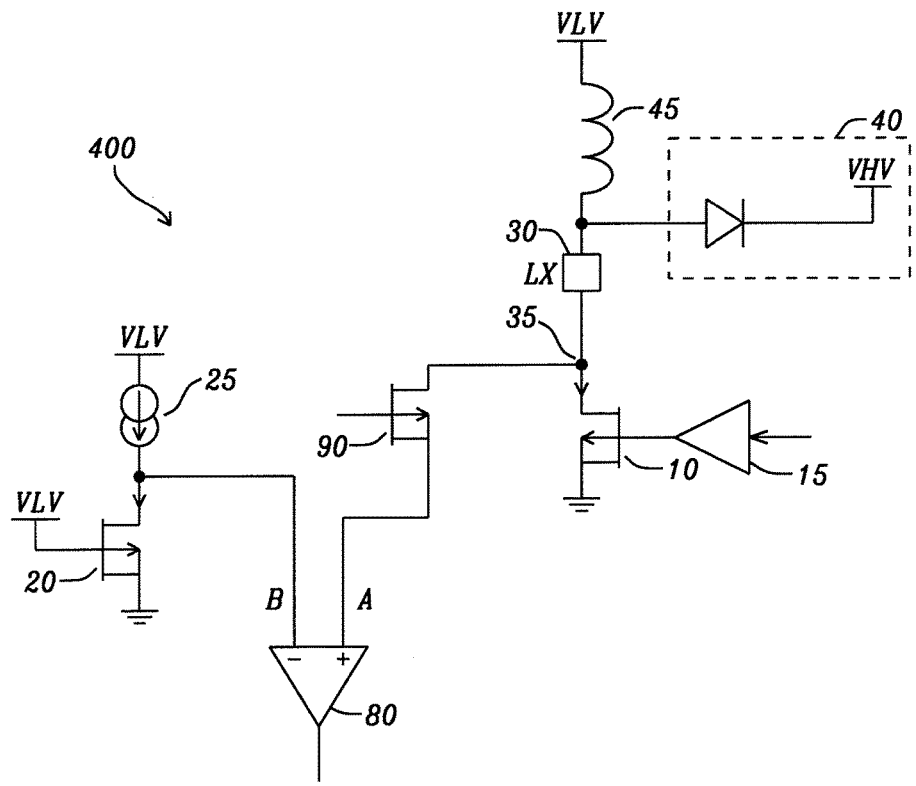

FIG. 6 schematically illustrates an example of a high voltage switching converter 400 (in particular, a boost converter). The voltage converter 400 comprises an inductive element 45, e.g. an inductor, connected between a supply voltage level (VLV) and a switching node 30 (LX node) of the voltage converter 400. The supply voltage may be a high voltage in excess of a voltage tolerance of typical low voltage devices. The voltage converter 400 further comprises a pass device 10, e.g. a pass transistor (high voltage power transistor) connected between the switching node 30 and ground. Thus, the inductive element 45 and the pass device 10 may be said to be connected in series between the supply voltage level and ground, with the switching node 30 interposed in between. The pass device 10 may be a MOS transistor, such as a MOSFET, e.g. a PMOS transistor or an NMOS transistor. An electric load 40 may be connected to the switching node 30 of the voltage converter 400. The pass device 10 may be switched between a conducting state (e.g. a fully conducting state) and a non-conducting state. Said switching may proceed under control of a drive signal, e.g. a drive signal output by a driver 15. The drive signal may be supplied to a control terminal (e.g. gate terminal) of the pass device 10. Further, the drive signal may have at least a first level (e.g. a high level, such as the supply voltage level) and a second level (e.g. a low level, such as ground), wherein the pass device 10 switches to the conducting state if the drive signal has the first level and to the non-conducting state if the drive signal has the second level.

The switching node 30 of the voltage converter 400 is connected to a first input port (node A) of a comparator 80 through a (high voltage) blanking switch 90. The blanking switch 90 is necessary since the comparator 80 can normally be implemented only with low voltage devices, i.e. since the comparator 80 normally is a low voltage comparator. The blanking switch 90 may be switched in dependence on the drive signal. In particular, the blanking switch 90 may be switched to the non-conducting state if the pass device 10 is in the non-conducting state. In this case, the voltage at the switching node 30 rises to the supply voltage level and thus must not be applied to the input port of the (low voltage) comparator 80 in order to avoid damage of the comparator 80. On the other hand, the blanking switch 90 may be switched to the conducting state if the pass device 10 is in the conducting state. The blanking switch 90 in FIG. 6 is implemented by a transistor with source and bulk terminals connected to each other.

The voltage converter 400 further comprises a replica device 20 of the pass device 10. The replica device 20 is of the same type as the pass device 10, but may be scaled down in size (i.e. may have a scaled-up on-state resistance compared to the pass device 10). Thus, the replica device 20 may be a scaled replica of the pass device, e.g. with a scaling factor of 1:N, with N greater than or equal to 1. The replica device 20 is connected in series with a (constant) current source 25 between the supply voltage level and ground. Further, a voltage corresponding to the first level of the drive signal (e.g. the supply voltage level VLV) is applied to a control terminal (e.g. gate terminal) of the replica device 20. Thus, identical voltages are applied to the terminals of the replica device 20 and respective terminals of the pass device 10, at least while the drive signal at the control terminal of the pass device 10 has the first level (i.e. at least while the pass device 10 is in the conducting state).

An intermediate node between the current source 25 and the replica device 20 is connected to the second input port (node B) of the comparator 80. Since the replica device 20 is always in the conducting state, the voltage at said intermediate node is lower than the supply voltage level, and the intermediate node may be connected directly to the second input port (node B) of the comparator 80. The voltage at the intermediate node may be indicative of a reference value for the current flowing through the pass device 10 (e.g. a threshold value for switching the voltage converter). Thus, the voltage at the intermediate node may be referred to as a reference voltage. The replica device 20 together with the current source 25 may be referred to as a reference circuit for providing a reference voltage or an indication of a reference current.

While the pass device 10 is in the conducting state, the comparator 80 compares the voltage at the switching node 30 of the voltage converter 400 to the voltage at the intermediate node between the current source 25 and the replica device 20. Once the voltage at the switching node 30 reaches the voltage at said intermediate node, an output level of the comparator changes (i.e. the comparator 80 trips). The output of the comparator 80 may be used to control the voltage converter 400, e.g. to derive the drive signal therefrom. That is, the output of the comparator 80 may be supplied to a logic circuit for generating the drive signal. The pass device 10 may be switched to the non-conducting state once the voltage at the switching node 30 reaches the voltage at said intermediate node (i.e. once the comparator 80 trips).

Figure 7:
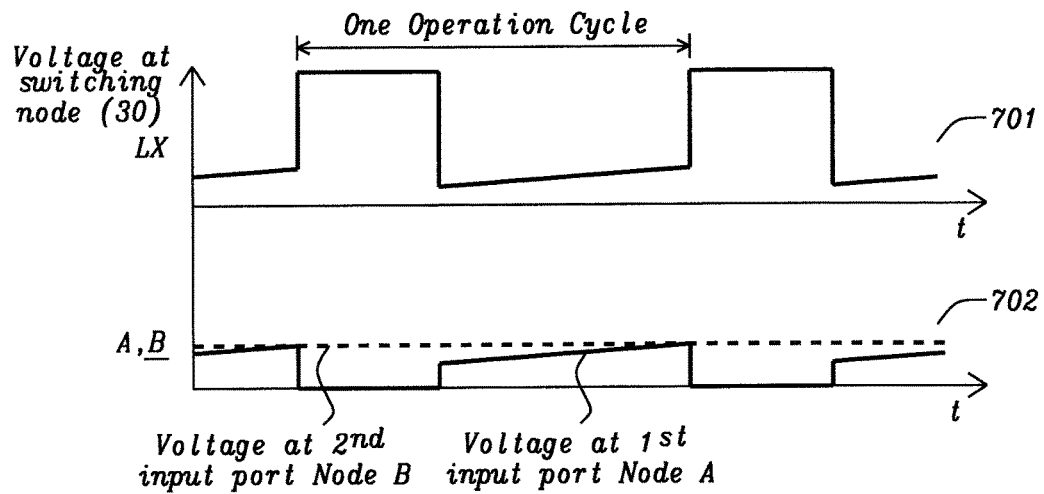
FIG. 7 is a time chart schematically illustrating voltage levels and control signal levels in the voltage converter of FIG. 6.

FIG. 7 is a time chart schematically illustrating voltage levels and control signal levels in the voltage converter 400 of FIG. 6. The uppermost graph 701 indicates the voltage level at the switching node 30. The lowermost graph 702 indicates the voltages at the input ports of the comparator 80, wherein the solid line indicated the voltage at the first input port (node A) and the dashed line indicates the voltage at the second input port (node B). The voltage at the second input port (node B) of the comparator 80 is substantially constant. The voltage at the first input port (node A) of the comparator 80 is substantially zero while the voltage at the switching node 30 takes its high level (i.e. while the pass device 10 and the blanking switch 30 are in the non-conducting state). Once the voltage at the switching node 30 takes its low level (i.e. while the pass device 10 and the blanking switch 30 are in the conducting state), the voltage at the first input port (node A) of the comparator 80 rises (due to the presence of the inductive element 45) until it reaches the reference voltage. At this point, the comparator 80 trips and the pass device 10 is disabled, i.e. the pass device 10 is switched to the non-conducting state.

Thus, the operation of the voltage converter 400 in FIG. 6 is the following: the driver 15 turns on the pass device 10, i.e. switches the pass device 10 to the conducting state. Once the voltage at the switching node 30 goes down, the blanking switch 90 will turn on (i.e. will switch to the conducting state) and the switching node 30 will be connected to the first input port (node A) of the comparator 80. The comparator 80 will trip once the voltage on the first input port (node A) of the comparator 80 exceeds the voltage at the second input port (node B) of the comparator 80 and the pass device 10 is turned off.

The voltage converter 400 illustrated in FIG. 6 has the problem that implementing the blanking switch 90 may be difficult. Namely, when using a transistor as the blanking switch 90, the transistor should be either an isolated device, or if not an isolated device, the transistor should be able to withstand a source-to-bulk voltage of 1V or more. However, implementing such devices is difficult and requires a large number of extra of layers, or may even be impossible if bulk-to-drain voltages in excess of e.g. 30V are to be accommodated for.

Another drawback lies in the fact that for low supply voltages and/or high inductor currents, the transistor implementing the blanking switch 90 may stop operating reliably due to bulk effects.

These problems and drawbacks are addressed by circuits and methods according to embodiments of the disclosure.

Figure 1:
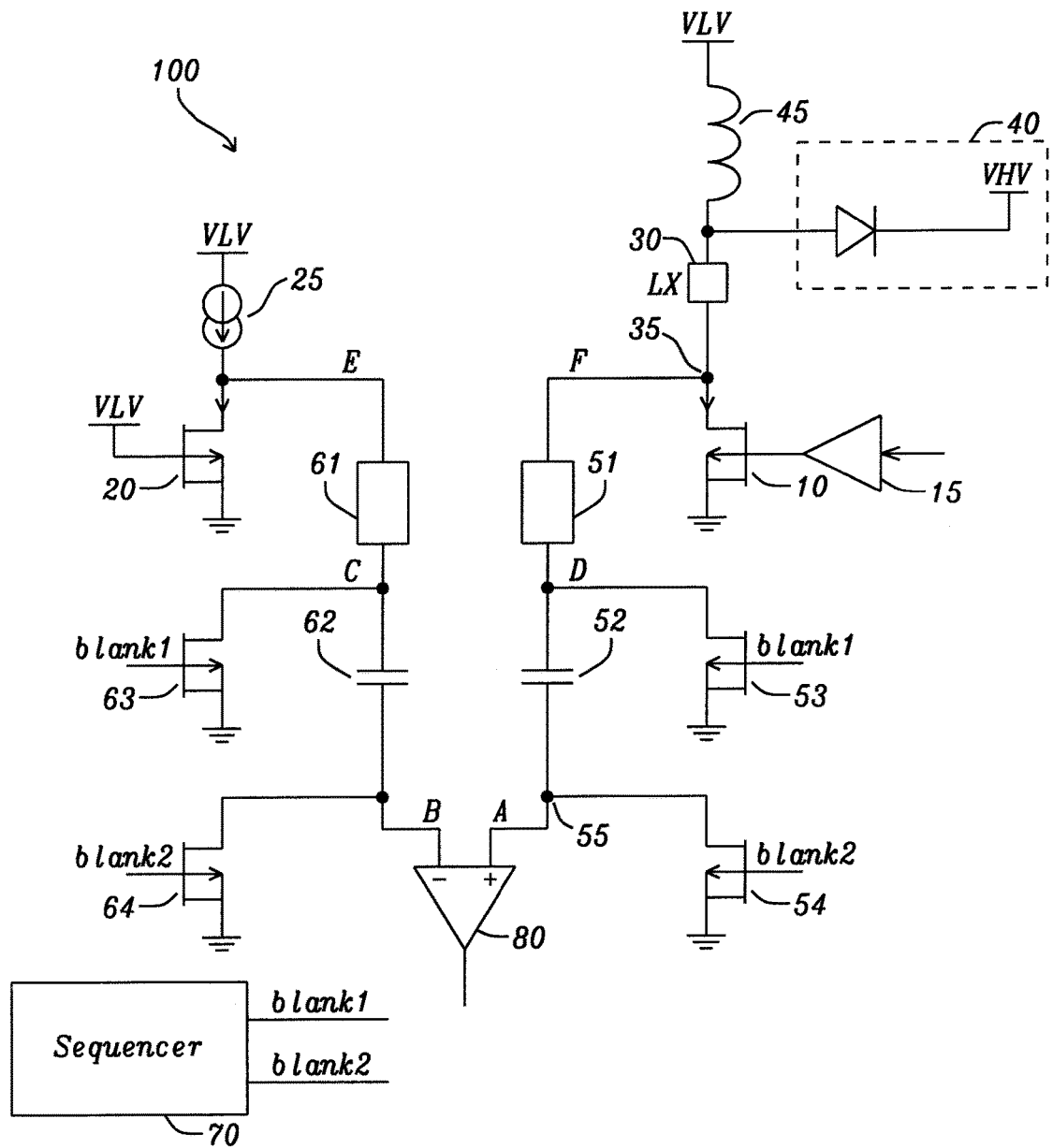

FIG. 1 schematically illustrates an example of a circuit for sensing a current flowing through a pass device of a voltage converter 100 according to embodiments of the disclosure. The circuit for sensing the current flowing through a pass device of a voltage converter 100 may be part of the voltage converter 100, or may be external to the voltage converter 100, depending on circumstances. The present disclosure is not to be understood to be limited to either of these cases.

Unless indicated otherwise, elements in FIG. 1 and FIG. 6 that have the same reference numerals are identical, and repeated description thereof is omitted. Respective statements made above are understood to apply also here.

Compared to the voltage converter 400 of FIG. 6, the voltage converter 100 comprises first and second capacitive elements, (optional) first and second resistive elements 51, 61, first to fourth switching elements 53, 54, 63, 64, and a control circuit 70, such as a sequencer, for example.

The circuit for sensing the current flowing through the pass device of a voltage converter 100 may be said to comprise the (optional) first resistive element 51, the first capacitive element and first and second switching elements 53, 54. The circuit may further comprise the control circuit 70. The circuit may further comprise the reference circuit. The circuit may yet further comprise the second resistive element 61, the second capacitive element, and third and fourth switching elements 63, 64.

The first resistive element 51 and the first capacitive element may be connected in series between the switching node 30 of the voltage converter 100 an output node 55 of the circuit. The first resistive element 51 and the first capacitive element may also be said to be connected in series between a terminal (e.g. a drain terminal) of the pass device 10 (or an intermediate node 35 (node F) between the switching node 30 and said terminal) and said output node 55. Thus, a first terminal of the first capacitive element 51 may be connected (optionally via the first resistive element 51) to the switching node 30 (or the terminal of the pass device 10), and a second terminal of the first capacitive element may be connected to the output node 55. The first capacitive element may comprise or may correspond to a first capacitor 52, as shown in the example of FIG. 1. The first resistive element 51 may comprise or may correspond to a first resistor, as further shown in the example of FIG. 1.

The first resistive element 51 may serve to limit a current under certain circumstances, as will be described in more detail below, and might be omitted, e.g. if current consumption is not a concern. The output node 55 may provide an indication of the current flowing through the pass device 10 of the voltage converter 100 and may be connected e.g. to the first input port (node A) of the comparator 80.

The first switching element 53 may be connected between ground and an intermediate node (node D) between the first terminal of the first capacitive element and the terminal of the pass device 10, or if the first resistive element 51 is provided, between ground and an intermediate node (node D) between said first terminal of the first capacitive element and the first resistive element 51. The second switching element 54 may be connected between the second terminal of the first capacitive element and ground, i.e. between the output node 55 and ground. Accordingly, the first and second switching elements 53, 54 may short respective nodes of the circuit to ground and may thus be referred to as shorting switches.

The first and second switching elements 53, 54 may be controllable switching elements and may be implemented e.g. by transistors, such as MOS transistors, or MOSFETs, e.g. PMOS transistors or NMOS transistors. The first switching element 53 may be switched under control of a first control signal (blank1), i.e. the first control signal may be applied to a control terminal (e.g. gate terminal) of the first switching element 53. The second switching element 54 may be switched under control of a second control signal (blank2), i.e. the second control signal may be applied to a control terminal (e.g. gate terminal) of the second switching element 54.

The first and second control signals may be generated by the control circuit 70. The first and second control signals may be generated on the basis of the drive signal for the pass device 10, e.g. may be derived from said drive signal. Thus, the control circuit 70 may be said to control switching of the first and second switching elements 53, 54 (and also of the third and fourth switching elements 54, 64 described in more detail below).

As indicated above, the circuit may further comprise the second resistive element 61, the second capacitive element, and the third and fourth switching elements 63, 64. The second resistive element 61 and the second capacitive element may be connected in series between the reference circuit, more precisely, an intermediate node (node E) between the current source 25 and the replica device 20, and the second input port (node B) of the comparator 80. Thus, a first terminal of the second capacitive element may be connected (optionally via the second resistive element 61) to said intermediate node (node E) of the reference circuit, and a second terminal of the second capacitive element may be connected to the second input port (node B) of the comparator 80. The second resistive element 61 serves to limit a current under certain circumstances, as will be described in more detail below, and might be omitted, e.g. if current consumption is not a concern. Notably, the first and second resistive elements 51, 61 may be identical (e.g. in type and size), and the first and second capacitive elements may be identical (e.g. in type and size). Thus, the second capacitive element may comprise or may correspond to a second capacitor 62, as shown in the example of FIG. 1. The second resistive element 61 may comprise or may correspond to a second resistor, as further shown in the example of FIG. 1.

The third switching element 63 may be connected between ground and an intermediate node (node C) between the first terminal of the second capacitive element and the intermediate node (node E) of the reference circuit, or if the second resistive element 61 is provided, between ground and an intermediate node (node C) between said first terminal of the second capacitive element and the second resistive element 61. The fourth switching element 64 may be connected between the second terminal of the second capacitive element and ground, i.e. between the second input port (node B) of the comparator 80 and ground.

The third and fourth switching elements 63, 64 may be controllable switching elements and may be implemented e.g. by transistors, such as MOS transistors, or MOSFETs, e.g. PMOS transistors or NMOS transistors. Notably, the first and third switching elements 53, 63 may be identical (e.g. in type and size), and the second and fourth switching elements 54, 64 may be identical (e.g. in type and size).

The third switching element 63 may be switched under control of the aforementioned first control signal (blank1), i.e. the first control signal may be applied to a control terminal (e.g. gate terminal) of the third switching element 63. The fourth switching element 64 may be switched under control of the aforementioned second control signal (blank2), i.e. the second control signal may be applied to a control terminal (e.g. gate terminal) of the fourth switching element 64.

In the above, the first and second capacitive elements, the first and second resistive elements 51, 61, and the first and third switching elements 53, 63 may by high voltage tolerant elements. On the other hand, the second and fourth switching elements 54, 64, as well as the comparator 80 may be low voltage elements.

As indicated above, the reference voltage that is applied to the second input port (node B) of the comparator 80 is lower than the supply voltage level, since the replica device 20 is always in the conducting state, so that the reference circuit may be connected directly to the second input port (node B) of the comparator 80. Accordingly, the second resistive element 61, the second capacitive element, the third switching element 63, and the fourth switching element 64 might be altogether omitted. However, providing these elements may aid to ensure symmetry between the circuit branches that are connected to the respective inputs to the comparator 80.

Figure 2:
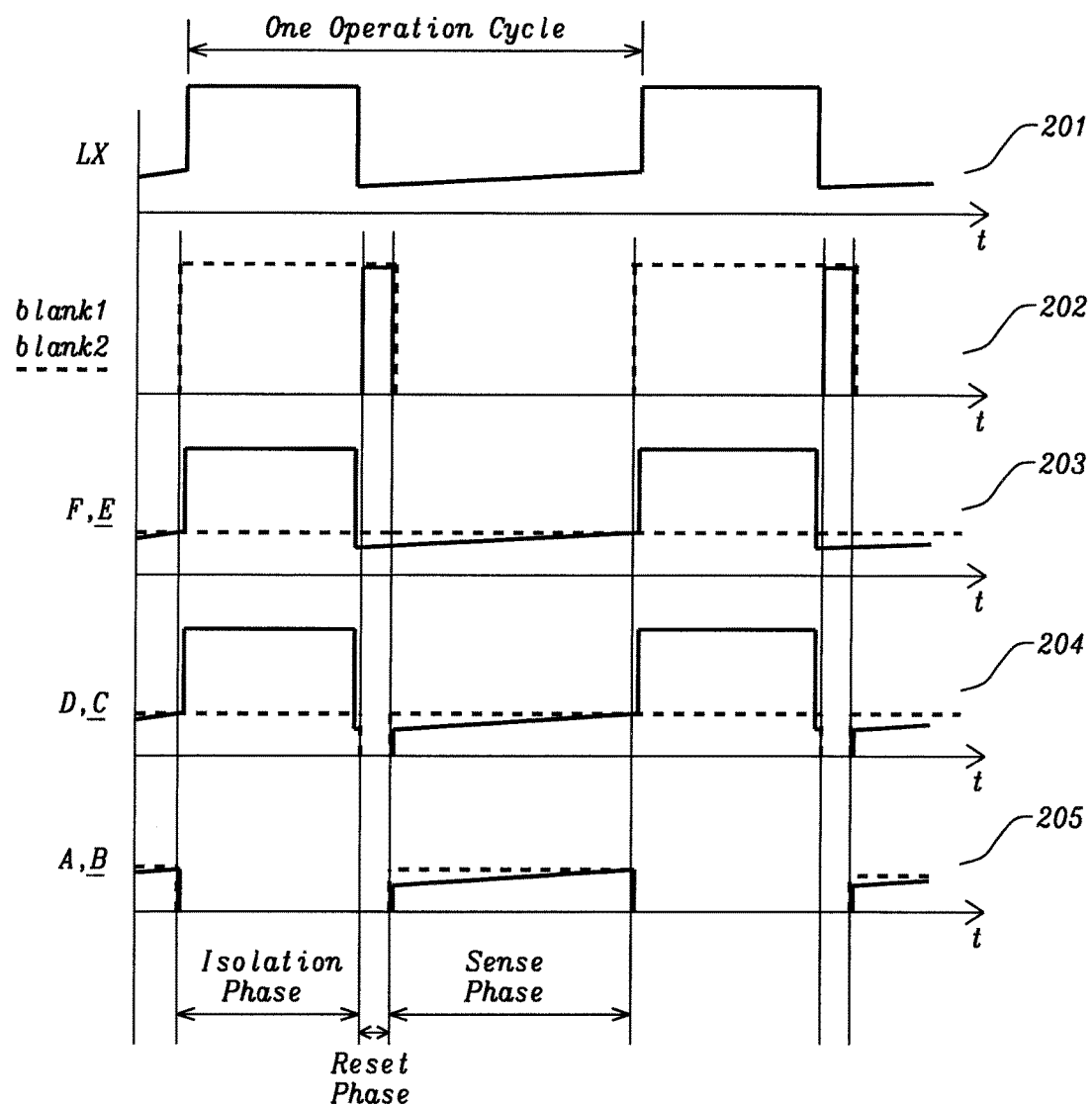
FIG. 2 is a time chart schematically illustrating voltage levels and control signal levels in the circuit of FIG. 1.
Figure 3:
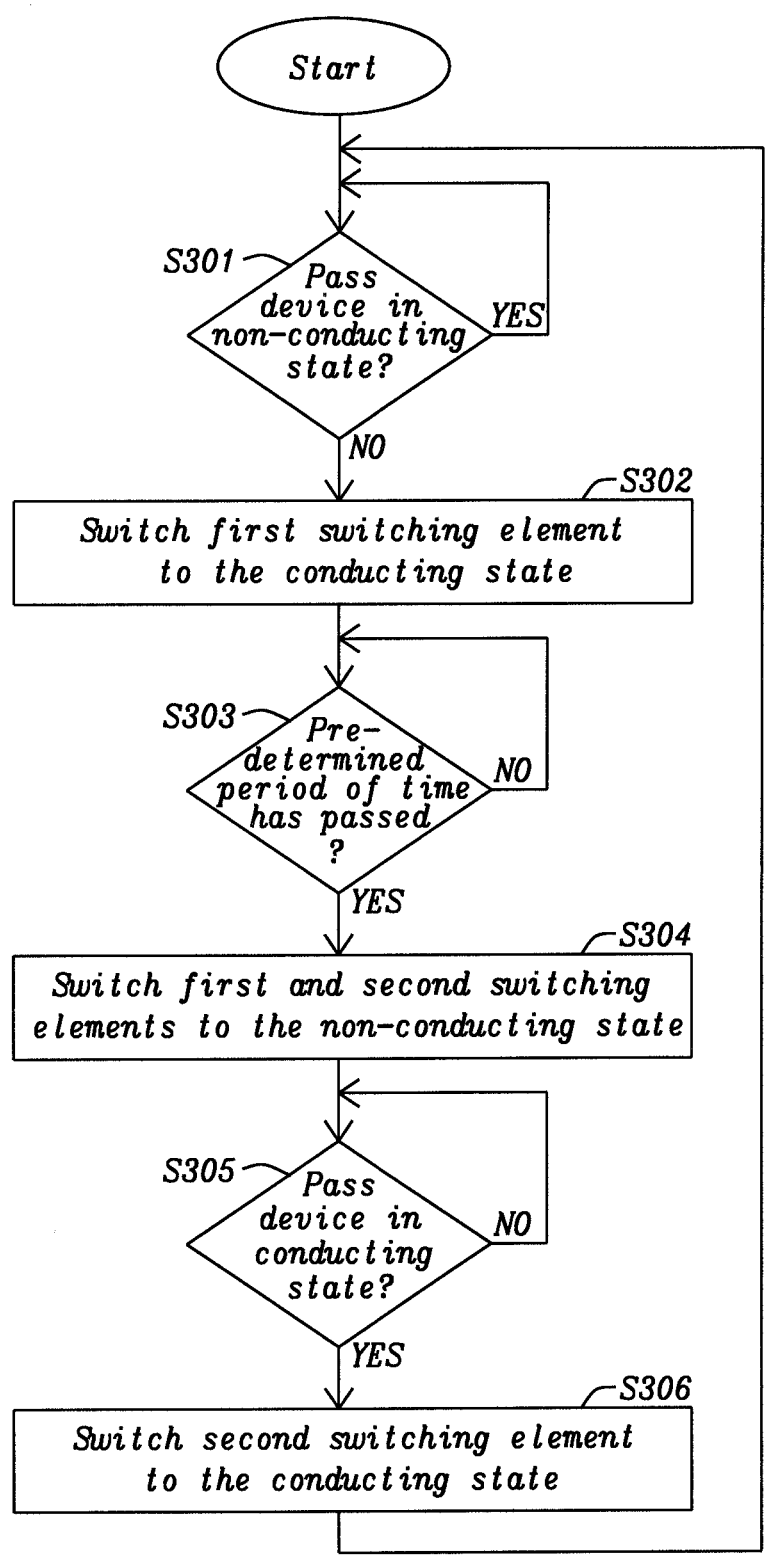
FIG. 3 is a flow chart schematically illustrating a switching scheme for switching elements in the circuit of FIG. 1, FIG. 4 schematically illustrates another example of a circuit for sensing a current flowing through a pass device of a voltage converter according to embodiments of the disclosure, FIG. 5 schematically illustrates yet another example of a circuit for sensing a current flowing through a pass device of a voltage converter according to embodiments of the disclosure, FIG. 6 schematically illustrates an example of a voltage converter.

Operation of the voltage converter 100 will now be described with reference to FIG. 2 and FIG. 3. FIG. 2 is a time chart schematically illustrating control signal levels and voltage levels at respective nodes of the voltage converter 100. The uppermost graph 201 indicates the voltage level at the switching node 30. The second graph 202 from the top indicates the first and second control signals, wherein the solid line indicates the first control signal (blank1) and the dashed line indicates the second control signal (blank2). The third graph 203 from the top indicates the voltage levels at nodes F and E, wherein the solid line indicates the voltage level at node F, and the dashed line indicates the voltage level at node E. The fourth graph 204 from the top indicates the voltage levels at nodes D and C, wherein the solid line indicates the voltage level at node D, and the dashed line indicates the voltage level at node C. The lowermost graph 205 indicates the voltages at the input ports of the comparator 80, wherein the solid line indicates the voltage at the first input port (node A) and the dashed line indicates the voltage at the second input port (node B). FIG. 3 is a flow chart schematically illustrating a switching scheme for switching the switching elements in the voltage converter 100.

As starting point, it is assumed that the pass device 10 is in the non-conducting state, towards the end of an operation cycle of the voltage converter 100. Then, the second and fourth switching elements 54, 64 are in the conducting state, that is, the second control signal (blank2) takes a value for controlling the second and fourth switching elements 54, 64 to the conducting state (e.g. its high value). At the same time, the first and third switching elements 53, 63 are in the non-conducting state, that is, the first control signal (blank1) takes a value for controlling the first and third switching elements 53, 63 to the non-conducting state (e.g. its low value).

Broadly speaking, during this phase the voltage at the switching node 30 is high and the driver 15 is off. The first control signal (blank1) is low and the first and third switching elements 53, 63 are off (i.e. in the non-conducting state). The signal (i.e. voltage) on node C is equivalent to the signal on node E, and the signal on node F is equivalent to the signal on node D. At the same time, the second control signal (blank2) is high and the second and fourth switching elements 54, 64 are on (i.e. in the conducting state), forcing inputs of the comparator 80 to ground, i.e. shorting nodes A and B to ground. At this point, the high voltage from the switching node 30 is present on the first and second capacitive elements. This phase may be referred to as isolation phase.

At step S301, it is determined whether the pass device 10 is (still) in the non-conducting state. This determination may involve analyzing the drive signal for the pass device 10. If it is determined that the pass device 10 is (still) in the non-conducting state (YES in step S301), the method returns to step S301, i.e. the state of the pass device 10 may be continuously monitored. As indicated above, this monitoring may amount to monitoring the drive signal for the pass device 10. On the other hand, if it is determined that the pass device 10 is not in the non-conducting state anymore (NO in step S301), i.e. has been switched to the conducting state, the method proceeds to step S302.

As step S302, the first and third switching elements 53, 63 are switched to the conducting state, e.g. under control of the first control signal (blank1) generated by the control circuit 70. The second and fourth switching elements 54, 64 remain in the conducting state. Broadly peaking, once the pass device 10 has been turned on (i.e. is in the conducting state), the voltage at the switching node 30 goes down, discharging the first capacitive element to low voltage. The control circuit 70 (e.g. sequencer) outputs the high level for the first control signal (blank1), i.e. the control circuit 70 makes the first control signal go high. When the first control signal goes high, the first and third switching elements 53, 63 are switched on (i.e. to the conducting state), thereby forcing the inputs of the first and second capacitive elements (i.e. their respective first terminals) to ground. Since the voltage at the switching node 30 is low (e.g. smaller than 1V in comparison to larger than 20V when the pass device 10 is off), only a small current is flowing through the first and second resistive elements 51, 61. At this point (first and second control signals high), the voltages across the first and second capacitive elements are equal to zero. Thus, this phase may be referred to as reset phase.

At step S303, it is determined whether a predetermined period of time has passed. The predetermined period of time may be short compared to the overall duration of the time period during which the pass device 10 is in the conducting state. If the predetermined period of time has not yet passed (NO at step S303), the method returns to step S303. On the other hand, if the predetermined period of time has passed, the method proceeds to step 304.

At step S304, the first and third switching elements 53, 63 are switched to the non-conducting state, e.g. under control of the first control signal (blank1) generated by the control circuit 70. Likewise, the second and fourth switching elements 54, 64 are switched to the non-conducting state, e.g. under control of the second control signal (blank2) generated by the control circuit 70. Thus, the first to fourth switching elements 53, 54, 63, 64 remain in the conducting state until the predetermined period of time has elapsed (second period of time in the claims), and are afterwards switched to the non-conducting state.

Broadly speaking, after a short time (i.e. after the predetermined period of time), the first and second control signals (blank1, blank2) will go low. Consequently, the first to fourth switching elements 53, 54, 63, 64 will be switched off, and the signal (i.e. voltage) at node A will be equivalent to the voltage at the switching node 30, and the signal at node B will be equivalent to the signal at node E (i.e. the drain voltage at the replica device 20). At this point, the first and second capacitive elements serve as a signal short (assuming that the first and second resistive elements 51, 61 are small). This phase, which continues until the pass device 10 is switched to the non-conducting state, may be referred to as sense phase.

With each new operation cycle of the voltage converter 100, the above process flow repeats. Thus, the first to fourth switching elements 53, 54, 63, 64 remain in the non-conducting state until the pass device is switched back to the non-conducting state (first period of time in the claims).

With the new operation cycle of the voltage converter 100, the drive signal goes low and the pass device 10 is switched to the non-conducting state. Accordingly, the voltage at the switching node 30 goes high. In reaction, the second control signal (blank2) goes high, while the first control signal (blank1) remains low.

The above switching operations of the first to fourth switching elements 53, 54, 63, 64 may proceed under control of the control circuit 70. Thus, the control circuit may be said to control the first and second switching elements 53, 54 such that the output node 55 (or the first input port of the comparator 80) is isolated from the terminal of the pass device 10 (or the switching node 30) through the first capacitive element while the pass device 10 is in the non-conducting state (i.e. during the isolation phase), and such that the voltage at the terminal of the pass device 10 (or at the switching node 30) is applied to the output node 55 (or the first input port of the comparator 80) during a first period of time for which the pass device 10 is in the conducting state (i.e. during the sense phase). Analogous statements apply to the third and fourth switching elements 63, 64.

Summarizing the above switching sequence, the control circuit 70 may control the first switching element 53 to (switch to) the non-conducting state while the pass device 10 is in the non-conducting state (i.e. during the isolation phase), and control the second switching element 54 to (switch to) the conducting state while the pass device 10 is in the non-conducting state. Further, the control circuit 70 may control the first and second switching elements 53, 54 to (switch to) the conducting state during a second period of time for which the pass device 10 is in the conducting state (i.e. during the reset phase). Yet further, the control circuit 70 may control the first and second switching elements 53, 54 to (switch to) the non-conducting state during the first period of time (i.e. during the sense phase). Therein, the first period of time (sense phase) may succeed (i.e. follow after) the second period of time (reset phase). The control circuit 70 may further control the third switching element 63 to switch in phase with the first switching element 53, and control the fourth switching element 64 to switch in phase with the second switching element 54.

The switching sequence described above and illustrated in FIG. 2 and FIG. 3 results in only small power loss on the first and second capacitive elements. For example, for a capacitance of the first and second capacitive elements of $C_1=C_2=10$ pF, a switching frequency of the pass device 10 of $f_{sw}=1$ MHz, an output voltage of $V_{out}=20$V and an output power of $P_{out}=1$ W, the efficiency loss resulting from providing the first and second capacitive elements (i.e. compared to the voltage converter 400 of FIG. 6) is found to be only about 0.4%.

Further, when simulating operation of the voltage converter 100 for $C_1=C_2=10$ pF and for resistances of the first and second resistive elements of $R_1=R_2=1$ kΩ, it is found that even for an amplitude for the voltage at the switching node 30 of 10V, the voltages at nodes A and B always stay below 5V, which allows to use a low voltage comparator.

Next, the respective functions of the elements of the circuit will be summarized. The first and second resistive elements 51, 61 limit the current flowing into the first and third switching elements 53, 63 or to ground during the reset phase. Thus, the first and second resistive elements 51, 61 may also be referred to as current limiting resistive elements (e.g. current limiting resistors). The first and second capacitive elements serve as equivalent signal shorts between node A and node D, and between node B and node C, respectively, during the sense phase. Thus, the first and second capacitive elements may also be referred to as isolation capacitive elements (e.g. isolation capacitors). The first and third switching elements 53, 63 serve as shorting switches of nodes D and C, respectively, during the reset phase. The second and fourth switching elements 54, 64 serve as the shorting switches of the nodes F and E, respectively, during reset phase.

Figure 4:
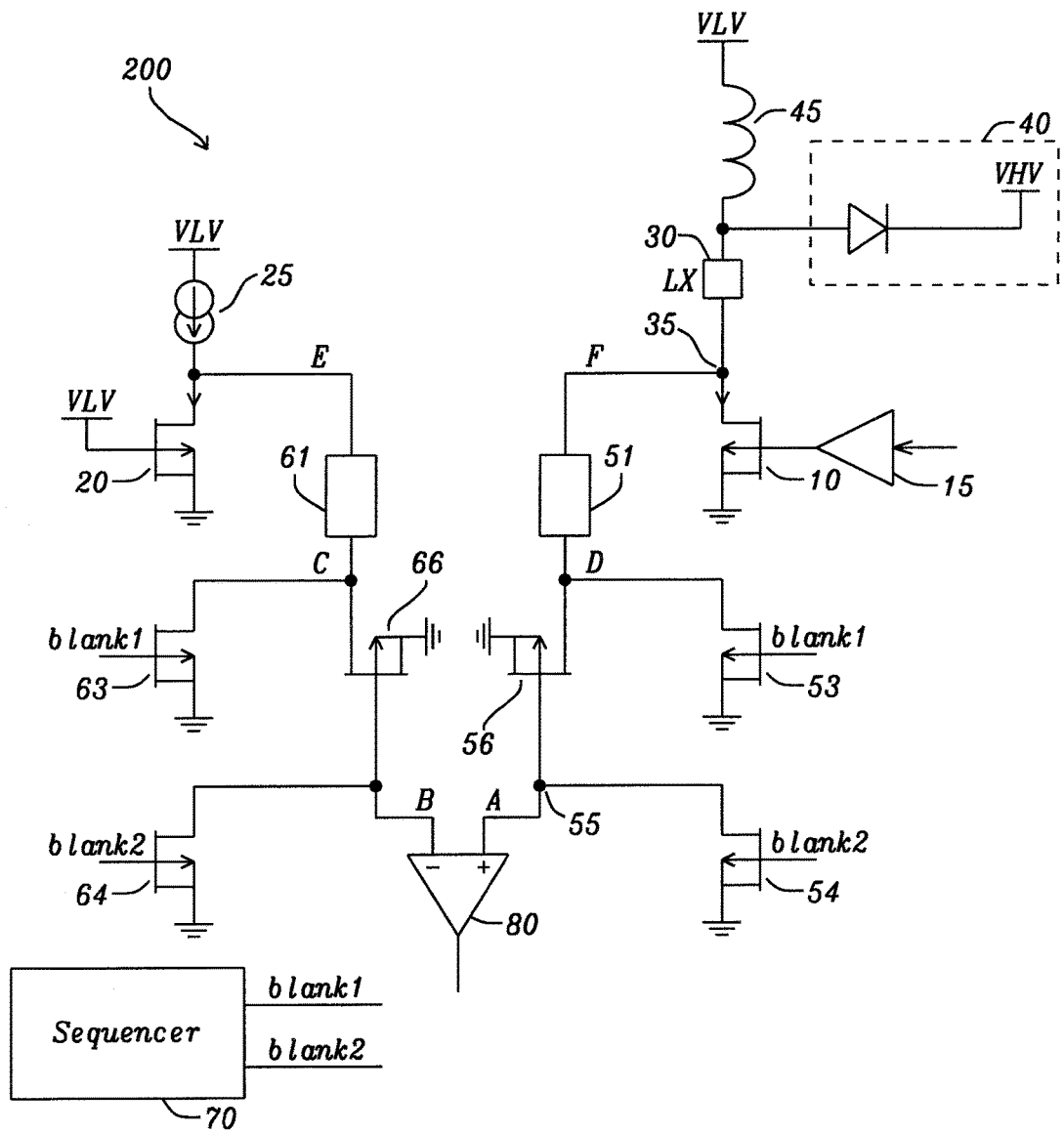

FIG. 4 schematically illustrates another example of a circuit for sensing a current flowing through a pass device of a voltage converter 200 according to embodiments of the disclosure. Compared to the voltage converter 100 of FIG. 1, the first and second capacitive elements are implemented by first and second transistors 56, 66, respectively. The capacitors 52, 62 shown in FIG. 1 are substituted by the parasitic drain gate capacitances of the first and second transistors 56, 66, respectively.

The first and second transistors 56, 66 may be MOS transistors, such as MOSFETs, e.g. PMOS transistors or NMOS transistors. A source terminal and a bulk terminal of the first transistor 56 may be connected to each other and shorted to ground. The first transistor 56 may be arranged such that a drain terminal of the first transistor 56 implements the first terminal of the first capacitive element and a gate terminal of the first transistor 56 implements the second terminal of the first capacitive element. In this configuration, the capacitance of the first capacitive element would be provided for by a parasitic drain-gate capacitance of the first transistor 56. The second transistor 66 may be configured and arranged analogously so as to implement the second capacitive element.

When implementing the first and second capacitive elements by transistors, it is not required to employ high voltage capacitors for this purpose, e.g. if such high voltage capacitors are not available. On the other hand, the first and second transistors 56, 66 may be of same type as the high voltage transistors implementing the first and third switching elements 53, 63, and hence would always be available.

Figure 5:
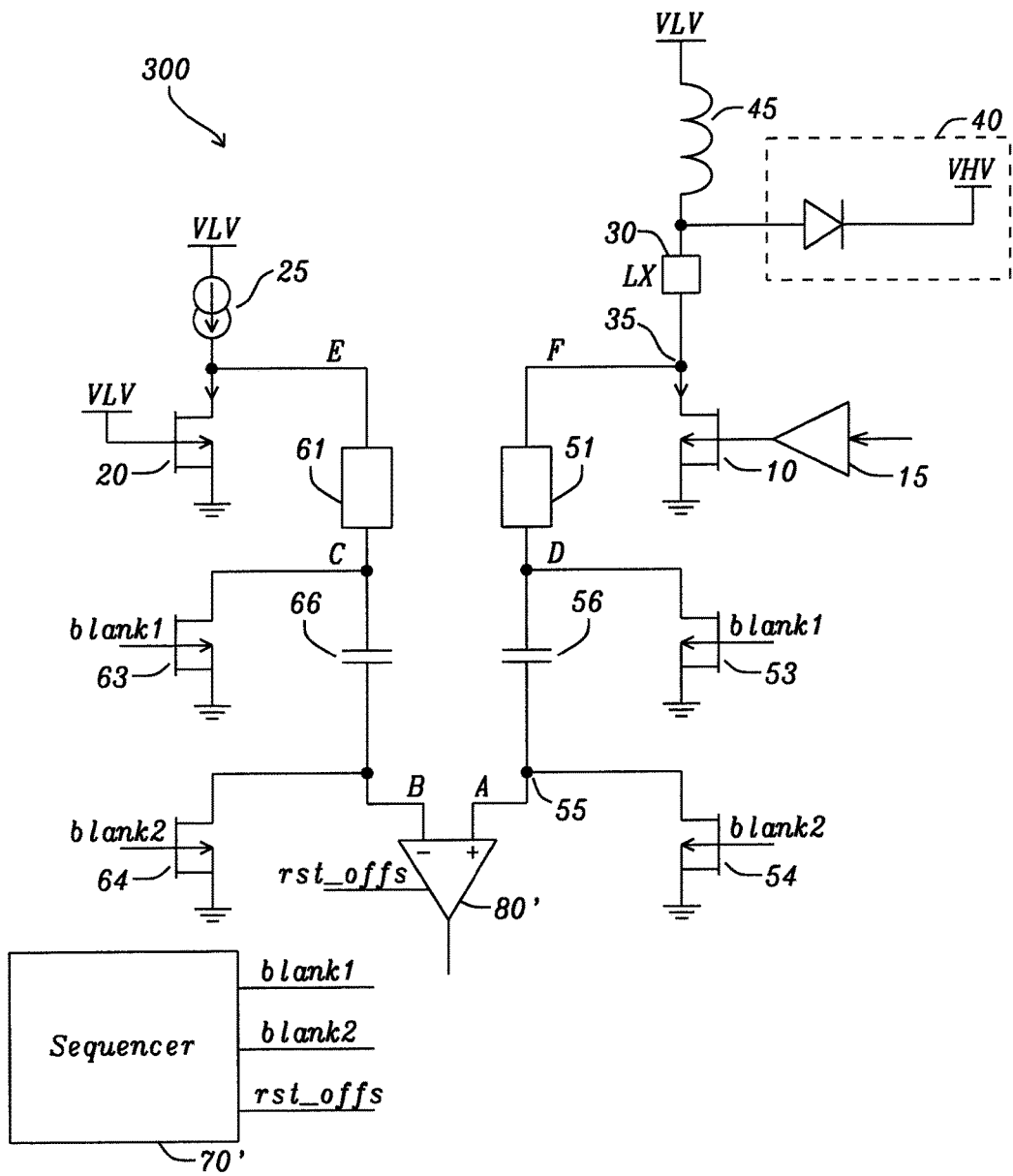

FIG. 5 schematically illustrates another example of a circuit for sensing a current flowing through a pass device of a voltage converter 300 according to embodiments of the disclosure. Compared to the comparator 80 in the voltage converter 100 of FIG. 1, the comparator 80' in the voltage converter 300 comprises an additional port for receiving a bias voltage that may be used to correct for an input offset of the comparator 80'. Moreover, the control circuit 70' in the voltage converter 300 differs from the control circuit 70 in the voltage converter 100 of FIG. 1 by being able to measure the input offset of the comparator 80' and to generate, on the basis of the measured input offset, a bias voltage or bias signal (rst_offs) for compensating the input offset of the comparator 80'.

The control circuit 70' may measure the input offset of the comparator 80' in a state in which each of the first to fourth switching elements 53, 54, 63, 64 are switched to the conducting state, i.e. during the reset phase. Namely, during said phase—the equivalent input offset of the comparator 80' may then be read out by the control circuit 70', and the bias voltage may be generated on the basis of the read-out value. The bias voltage may be provided to the comparator 80', e.g. to the port for receiving the bias signal. Notably, the input offset of the comparator 80' may be determined for each operation cycle of the voltage converter 300. The voltage converter 300 may thus provide for dynamic offset compensation of the comparator 80'.

Summarizing the above, key items of the present disclosure are the following: One key item of present disclosure relates to capacitive sensing of a voltage at the switching node or of a current flowing through the pass device. Another key item relates to forcing switches, i.e. first to fourth switching elements, forcing corresponding nodes of the circuit to ground. Another key item relates to limiting resistors for limiting the current flowing to ground. Another key item relates to providing an isolation phase, a reset phase, and a sense phase, or corresponding modes of operation. Another key item relates to sequencing circuitry, i.e. the control circuit, which generates the correct sequence for the isolation, reset, and sense modes.

It should be noted that the apparatus features described above correspond to respective method features that may however not be explicitly described, for reasons of conciseness. The disclosure of the present document is considered to extend also to such method features. In particular, the present disclosure is understood to relate to methods of operating the circuits described above.

It should further be noted that the description and drawings merely illustrate the principles of the proposed apparatus. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed method. Furthermore, all statements herein providing principles, aspects, and embodiments of the invention, as well as specific examples thereof, are intended to encompass equivalents thereof.

What is claimed is:

1. A circuit for sensing a current flowing through a pass device of a voltage converter, wherein the pass device is switchable between a conducting state and a non-conducting state, the circuit comprising:
   an output node for providing an indication of the current flowing through the pass device;
   a capacitive element, wherein a first terminal of the capacitive element is coupled to a terminal of the pass device and a second terminal of the capacitive element is connected to the output node;
   a first switching element connected between the first terminal of the capacitive element and ground;
   a second switching element connected between the second terminal of the capacitive element and ground; and
   a control circuit for controlling the first and second switching elements,
   wherein the control circuit is configured to control the first and second switching elements such that the output node is isolated from the terminal of the pass device through the capacitive element while the pass device is in the non-conducting state, and the voltage at the terminal of the pass device is applied to the output node during a first period of time for which the pass device is in the conducting state.

2. The circuit according to claim 1, wherein the control circuit is configured to switch the first switching element to the non-conducting state and the second switching element to the conducting state while the pass device is in the non-conducting state.

3. The circuit according to claim 1, wherein the control circuit is configured to switch the first and second switching elements to the conducting state during a second period of time for which the pass device is in the conducting state.

4. The circuit according to claim 3, wherein the control circuit is configured to switch the first and second switching elements to the non-conducting state during the first period of time, wherein the first period of time succeeds the second period of time.

5. The circuit according to claim 1, further comprising a resistive element connected between the first terminal of the capacitive element and the terminal of the pass device.

6. The circuit according to claim 1, wherein the capacitive element comprises a capacitor.

7. The circuit according to claim 1, wherein the capacitive element comprises a transistor;
   a drain terminal of the transistor represents the first terminal of the capacitive element and a gate terminal of the transistor represents the second terminal of the capacitive element; and
   a source terminal and a bulk terminal of the transistor are connected to ground,
   so that the capacitance of the capacitive element is provided for by a parasitic drain-gate capacitance of the transistor.

8. The circuit according to claim 1, further comprising a comparator, wherein the output node is connected to an input port of the comparator.

9. The circuit according to claim 8, further comprising a reference circuit for providing an indication of a reference current to the other input port of the comparator.

10. The circuit according to claim 9, wherein the reference circuit comprises a replica device of the pass device and a current source connected in series with the replica device, and wherein voltages at terminals of the replica device correspond to those voltages that are present at respective terminals of the pass device while the pass device is in the conducting state.

11. The circuit according to claim 9, further comprising:
    a second capacitive element, wherein a first terminal of the second capacitive element is coupled to a terminal of the replica device and a second terminal of the second capacitive element is connected to said other input port of the comparator;
    a third switching element connected between the first terminal of the second capacitive element and ground; and
    a fourth switching element connected between the second terminal of the second capacitive element and ground,
    wherein the control circuit is configured to control the third switching element to switch in phase with the first switching element and to control the fourth switching element to switch in phase with the second switching element.

12. The circuit according to claim 11, further comprising a second resistive element connected between the first terminal of the second capacitive element and the terminal of the replica device.

13. The circuit according to claim 1, wherein the control circuit is further configured to measure an input offset of the comparator in a state in which both the first and second switching elements are switched to the conducting state, and to provide a bias voltage for compensating the input offset of the comparator.

14. A method of sensing a current flowing through a pass device of a voltage converter, wherein the pass device is switchable between a conducting state and a non-conducting state, and wherein the voltage converter further comprises:
- a node for providing an indication of the current flowing through the pass device;
- a capacitive element, wherein a first terminal of the capacitive element is coupled to a terminal of the pass device and a second terminal of the capacitive element is connected to said node;
- a first switching element connected between the first terminal of the capacitive element and ground; and
- a second switching element connected between the second terminal of the capacitive element and ground, the method comprising the steps of:
- controlling the first and second switching elements such that said node is isolated from the terminal of the pass device through the capacitive element while the pass device is in the non-conducting state; and
- controlling the first and second switching elements such and the voltage at the terminal of the pass device is applied to said node during a first period of time for which the pass device is in the conducting state.

15. The method according to claim 14, further comprising the step of:
- switching the first switching element to the non-conducting state and the second switching element to the conducting state while the pass device is in the non-conducting state.

16. The method according to claim 14, further comprising the step of:
- switching the first and second switching elements to the conducting state during a second period of time for which the pass device is in the conducting state.

17. The method according to claim 16, further comprising the step of:
- switching the first and second switching elements to the non-conducting state during the first period of time, wherein the first period of time succeeds the second period of time.

18. The method according to claim 14, further comprising the step of:
- comparing the indication of the current flowing through the pass device to an indication of a reference current.

19. The method according to claim 18, wherein the voltage converter further comprises:
- a replica device of the pass device for providing the indication of the reference current;
- a second capacitive element, wherein a first terminal of the second capacitive element is coupled to a terminal of the replica device and a second terminal of the second capacitive element is connected to said other input port of the comparator;
- a third switching element connected between the first terminal of the second capacitive element and ground; and
- a fourth switching element connected between the second terminal of the second capacitive element and ground, the method further comprising the steps of:
- controlling the third switching element to switch in phase with the first switching element; and
- controlling the fourth switching element to switch in phase with the second switching element.

20. The method according to claim 14, further comprising the steps of:
- measuring an input offset of the comparator in a state in which both the first and second switching elements are switched to the conducting state;
- providing a bias voltage for compensating the input offset of the comparator.

21. The method according to claim 14, further comprising a resistive element connected between the first terminal of the capacitive element and the terminal of the pass device.

22. The method according to claim 14, wherein the capacitive element comprises a capacitor.

23. The method according to claim 14, wherein the capacitive element comprises a transistor;
- a drain terminal of the transistor represents the first terminal of the capacitive element and a gate terminal of the transistor represents the second terminal of the capacitive element; and
- a source terminal and a bulk terminal of the transistor are connected to ground,
- so that the capacitance of the capacitive element is provided for by a parasitic drain-gate capacitance of the transistor.

24. The method according to claim 14, further comprising a comparator, wherein the output node is connected to an input port of the comparator.

25. The method according to claim 18, wherein the reference circuit comprises a replica device of the pass device and a current source connected in series with the replica device, and wherein voltages at terminals of the replica device correspond to those voltages that are present at respective terminals of the pass device while the pass device is in the conducting state.

26. The method according to claim 14, further comprising a second resistive element connected between the first terminal of the second capacitive element and the terminal of the replica device.

* * * * *